United States Patent
Wang et al.

(10) Patent No.: US 12,464,953 B2
(45) Date of Patent: Nov. 4, 2025

(54) METHOD FOR FABRICATING SEMICONDUCTOR DEVICE INCLUDING EMBEDDED MAGNETIC RESISTANCE RANDOM ACCESS MEMORY

(71) Applicant: UNITED MICROELECTRONICS CORP., Hsin-Chu (TW)

(72) Inventors: Hui-Lin Wang, Taipei (TW); Po-Kai Hsu, Tainan (TW); Hung-Yueh Chen, Hsinchu (TW); Chen-Yi Weng, New Taipei (TW); Si-Han Tsai, Taichung (TW); Jing-Yin Jhang, Tainan (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 629 days.

(21) Appl. No.: 17/516,669

(22) Filed: Nov. 1, 2021

(65) Prior Publication Data

US 2022/0059761 A1 Feb. 24, 2022

Related U.S. Application Data

(62) Division of application No. 16/689,100, filed on Nov. 20, 2019, now Pat. No. 11,195,994.

(30) Foreign Application Priority Data

Oct. 24, 2019 (CN) .......................... 201911015837.2

(51) Int. Cl.
  *H10N 50/01* (2023.01)
  *H10B 61/00* (2023.01)
  *H10N 50/80* (2023.01)

(52) U.S. Cl.
  CPC ............. *H10N 50/01* (2023.02); *H10B 61/00* (2023.02); *H10N 50/80* (2023.02)

(58) Field of Classification Search
  CPC ......... H10N 50/01; H10N 50/80; H10B 61/00
  See application file for complete search history.

(56) References Cited

U.S. PATENT DOCUMENTS

| | | | |
|---|---|---|---|
| 6,806,096 B1 * | 10/2004 | Kim ...................... | H10N 50/01 257/E27.005 |
| 11,195,994 B2 * | 12/2021 | Wang ..................... | H10N 50/01 |

(Continued)

FOREIGN PATENT DOCUMENTS

| | | |
|---|---|---|
| CN | 107302052 A | 10/2017 |
| CN | 109979961 A | 7/2019 |
| KR | 100245561 | 3/2000 |

OTHER PUBLICATIONS

Li, the specification, including the claims, and drawings in the TW application No. 107146555, Filing Date: Dec. 21, 2018.

Primary Examiner — Teresa M. Arroyo
(74) Attorney, Agent, or Firm — Winston Hsu

(57) ABSTRACT

A method of fabricating a semiconductor device includes the steps of: providing a semiconductor structure including a memory region and a logic region. The semiconductor structure includes a first interlayer dielectric and at least one magnetoresistive random access memory (MRAM) cell disposed on the first interlayer dielectric, and the MRAM cell is disposed in the memory region; depositing a second interlayer dielectric covering the first interlayer dielectric and the at least one MRAM cell; depositing a mask layer conformally covering the second interlayer dielectric; perform a planarization process to remove the mask layer in the memory region; after the step of performing the planarization process, removing the mask layer in the logic region.

9 Claims, 10 Drawing Sheets

(56) References Cited

U.S. PATENT DOCUMENTS

| | | |
|---|---|---|
| 2003/0124854 A1 | 7/2003 | Parker |
| 2004/0205958 A1* | 10/2004 | Grynkewich .......... H10N 50/01 |
| | | 29/603.12 |
| 2010/0046285 A1* | 2/2010 | Lung ................... G11C 11/5678 |
| | | 438/102 |
| 2011/0089511 A1* | 4/2011 | Keshtbod ............. G11C 11/161 |
| | | 257/422 |
| 2012/0070998 A1 | 3/2012 | Lim |
| 2015/0028492 A1* | 1/2015 | Jung ................ H01L 21/76831 |
| | | 257/774 |
| 2016/0181143 A1 | 6/2016 | Kwon |
| 2017/0301856 A1 | 10/2017 | Chuang |
| 2018/0097175 A1* | 4/2018 | Chuang ................. H10B 61/00 |
| 2019/0140018 A1* | 5/2019 | Kalnitsky ............ G11C 11/161 |
| 2019/0165258 A1* | 5/2019 | Peng ..................... H10N 50/01 |
| 2019/0280187 A1* | 9/2019 | Sonoda ................. H10N 50/80 |
| 2019/0326509 A1* | 10/2019 | Yi .......................... H10B 61/00 |
| 2020/0106007 A1 | 4/2020 | Peng |
| 2020/0219932 A1* | 7/2020 | Muthinti ............... H10N 50/80 |

\* cited by examiner

METHOD FOR FABRICATING SEMICONDUCTOR DEVICE INCLUDING EMBEDDED MAGNETIC RESISTANCE RANDOM ACCESS MEMORY

CROSS REFERENCE TO RELATED APPLICATIONS

The application is a division of U.S. application Ser. No. 16/689,100, filed on 2019/11/20, the disclosure of which is incorporated herein by reference in its entirety.

BACKGROUND OF THE INVENTION

1. Field of the Invention

The present disclosure relates to a method of forming a semiconductor device, and more particularly, to a method of fabricating a semiconductor device including an embedded magnetoresistive random access memory.

2. Description of the Prior Art

The size of semiconductor devices has been decreasing in recent years. For semiconductor technology, continuing to shrink semiconductor structure size, improve rate, improve performance, increase density, and reduce the cost per unit of integrated circuit is an important goal in the field semiconductor technology.

As semiconductor devices shrink in size, their electronic characteristics must still be maintained or even further improved to meet the market's requirements for advanced electronic products. For example, if the structures of layers or elements in the semiconductor device are damaged or the surface of the interlayer in the semiconductor device is not flat, these would negatively affect the electronic characteristics of the device.

In back-end-of-line (BEOL) processes for fabricating a semiconductor device, a planarization process is generally performed on the interlayer dielectric covering the substrate to obtain an interlayer dielectric with a flat surface. However, the end-point of the current planarization process is usually determined by the consuming time during the planarization process, which usually results in a large variation in height and flatness of the interlayer dielectric among different lots of wafers or different regions within the same wafer. The variations negatively affect the yield rate of the entire fabrication process.

Therefore, there is a need to provide an improved method of fabricating a semiconductor device to solve the drawbacks of the conventional fabrication method.

SUMMARY OF THE INVENTION

To this end, the present disclosure discloses a method of fabricating a semiconductor device so as to solve the drawbacks in the conventional fabrication process.

According to one embodiment of the present disclosure, a method of fabricating a semiconductor device includes the steps of: providing a semiconductor structure including a memory region and a logic region. The semiconductor structure includes a first interlayer dielectric and at least one magnetoresistive random access memory (MRAM) cell disposed on the first interlayer dielectric, and the MRAM cell is disposed in the memory region; depositing a second interlayer dielectric covering the first interlayer dielectric and the at least one MRAM cell; depositing a mask layer conformally covering the second interlayer dielectric; perform a planarization process to remove the mask layer in the memory region; after the step of performing the planarization process, removing the mask layer in the logic region.

According to another embodiment of the present disclosure, a method of fabricating a semiconductor device includes the steps of: providing a semiconductor structure including a first interlayer dielectric and at least one MRAM cell disposed on the first interlayer dielectric; depositing a second interlayer dielectric covering the first interlayer dielectric and the at least one magnetoresistive random access memory cell, where the second interlayer dielectric comprises a protrusion portion disposed on the MRAM cell; depositing a mask layer conformally covering the second interlayer dielectric; forming a patterned mask layer on the mask layer, where the patterned mask layer comprises an opening exposing the protrusion portion; etching the protrusion portion exposed from the opening to form a trench in the protrusion portion; and performing a planarization process to remove the protrusion portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
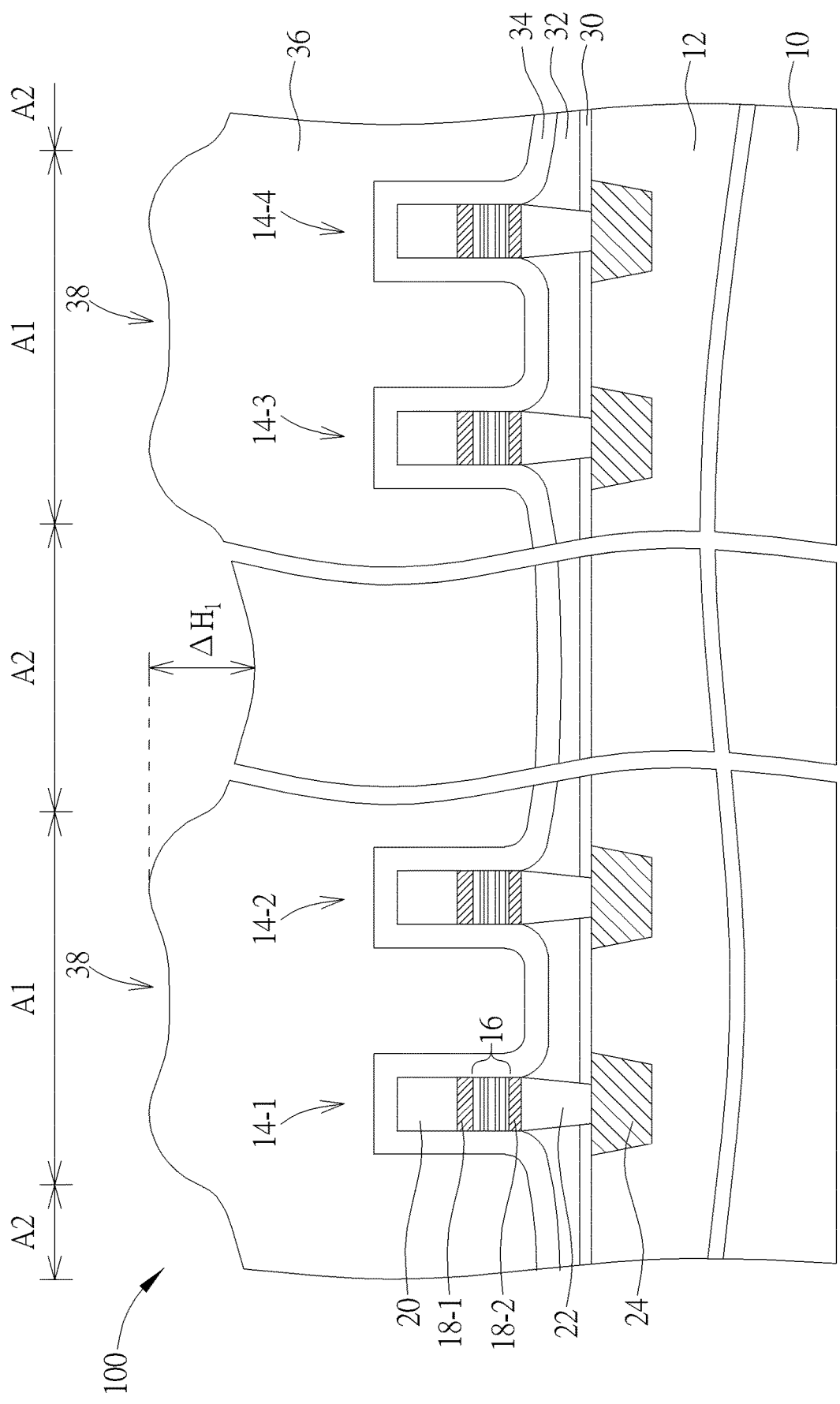
FIG. 1 is a schematic cross-sectional view of a semiconductor device after depositing an interlayer dielectric in accordance with an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each device shown in drawings are only illustrative and are not intended to limit the scope of the present disclosure.

Certain terms are used throughout the following description to refer to particular components. One of ordinary skill in the art would understand that electronic equipment manufacturers may use different technical terms to describe the same component. The present disclosure does not intend to distinguish between the components that differ only in name but not function. In the following description and claims, the terms "include", "comprise", and "have" are used in an open-ended fashion and thus should be interpreted as the meaning of "include, but not limited to".

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

When an element or layer is referred to as being "coupled to" or "connected to" another element or layer, it may be directly coupled or connected to the other element or layer, or intervening elements or layers may be presented. In contrast, when an element is referred to as being "directly coupled to" or "directly connected to" another element or layer, there are no intervening elements or layers presented.

Further, spatially relative terms, such as "beneath," "below," "lower," "above," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be noted that the technical features in different embodiments described in the following may be replaced, recombined, or mixed with one another to constitute another embodiment without departing from the spirit of the present disclosure.

FIG. 1 is a cross-sectional view of a semiconductor device after depositing an interlayer dielectric in accordance with an embodiment of the present disclosure. Referring to FIG. 1, a semiconductor device 100 includes a substrate 10, a first interlayer dielectric 12, a metal interconnection 24, embedded magnetoresistive memory (MRAM) cells 14-1 to 14-4, and a second interlayer dielectric 36. The semiconductor device 100 may be divided into at least two regions, such as a memory region A1 and a logic region A2. As used herein, the "memory region" refers to a region of the semiconductor device 100 in which a memory cell may be disposed between the first interlayer dielectric 12 and the second interlayer dielectric 36. The "logic region" refers to another region in the semiconductor device 100 in which no memory cells are disposed between the first interlayer dielectric 12 and the second interlayer dielectric 36. In addition, the area of the memory region A1 occupying the substrate is much smaller than the area of the logic region A2 occupying the substrate. For example, according to an embodiment of the present disclosure, the ratio of the area of the memory region A1 occupying the substrate 10 and the area of the logic region A2 occupying the substrate may be between 1:25 and 1:100.

The substrate 10 may be a semiconductor substrate or an insulating substrate. The first interlayer dielectric 12 may be disposed on the substrate 10 and may have a flat top surface. The first interlayer dielectric 12 may be composed of an ultra-low-k dielectric material having a dielectric constant of between 1.5 and 3.5. The metal interconnection 24 may be disposed in an upper region of the first interlayer dielectric 12, which may be electrically coupled to the embedded MRAM cells 14-1 to 14-4 disposed above, and may electrically couple the embedded MRAM cells 14-1 to 14-4 to the other parts of the semiconductor device 100 or other semiconductor devices. The embedded MRAM cells 14-1 to 14-4 are disposed on the first interlayer dielectric 12 and may include at least a bottom electrode 18-2 and a magnetic tunnel junction stack 16, a top electrode 18-1, and a mask layer 20. Each of the embedded MRAM cells 14-1 to 14-4 may be electrically coupled to the underlying metal interconnection 24 through the conductive plugs 22. The compositions of the bottom electrode 18-2 and the top electrode 18-1 may be a metal or an alloy including ruthenium (Ru). The magnetic tunnel junction stack 16 may include a fixed layer, a free layer, and a tunnel dielectric layer disposed between the fixed layer and the free layer. In addition, the magnetic tunnel junction stack 16 may also include an etch stop layer and a barrier layer, but not limited thereto. The mask layer 20 may be a conductive mask layer, which may be, for example, TiN. The second interlayer dielectric 36 may also be composed of an ultra-low dielectric constant material having a dielectric constant between 1.5 and 3.5.

In addition, other layers or elements may be disposed between the first interlayer dielectric 12 and the substrate 10, such as another interlayer dielectric, a metal interconnection, a conductive plug, or a semiconductor component, but not limited thereto. Moreover, an etch stop layer 30, a dielectric layer 32, and a protection layer 34 may be further disposed between the first interlayer dielectric 12 and the second interlayer dielectric 36. The composition of the etch stop layer 30 may be SiCN, and the etch stop layer 30 may be used to protect the metal interconnection 24 to avoid its top surface from being over etched during the process of forming the holes used to accommodate the conductive plugs 22. The composition of the protection layer 34 may be different from the composition of the mask layer 20 and the second interlayer dielectric 36, and may be, for example, SiN or other suitable insulating material. The protection layer 34 may conformally cover the embedded MRAM cells 14-1 to 14-4, and in particular, may cover the top surface of the mask layer 20 and the sides of the magnetic tunnel junction stack 16.

Still referring to FIG. 1, since the embedded MRAM cells 14-1 to 14-4 are disposed in the memory region A1, after depositing the second interlayer dielectric 36, the top surface of the second interlayer dielectric 36 in the memory region A1 may be higher than the top surface of the second interlayer dielectric 36 in the logic region A2 such that there is a height difference between the two, for example, the first height difference ΔH1. The first height difference ΔH1 may be between 500 angstroms and 2000 angstroms, but not limited thereto. The second interlayer dielectric 36 within the region defined by the above height difference, i.e. ΔH1, may be regarded as a protrusion portion 38 of the second interlayer dielectric 36.

Figure 2:
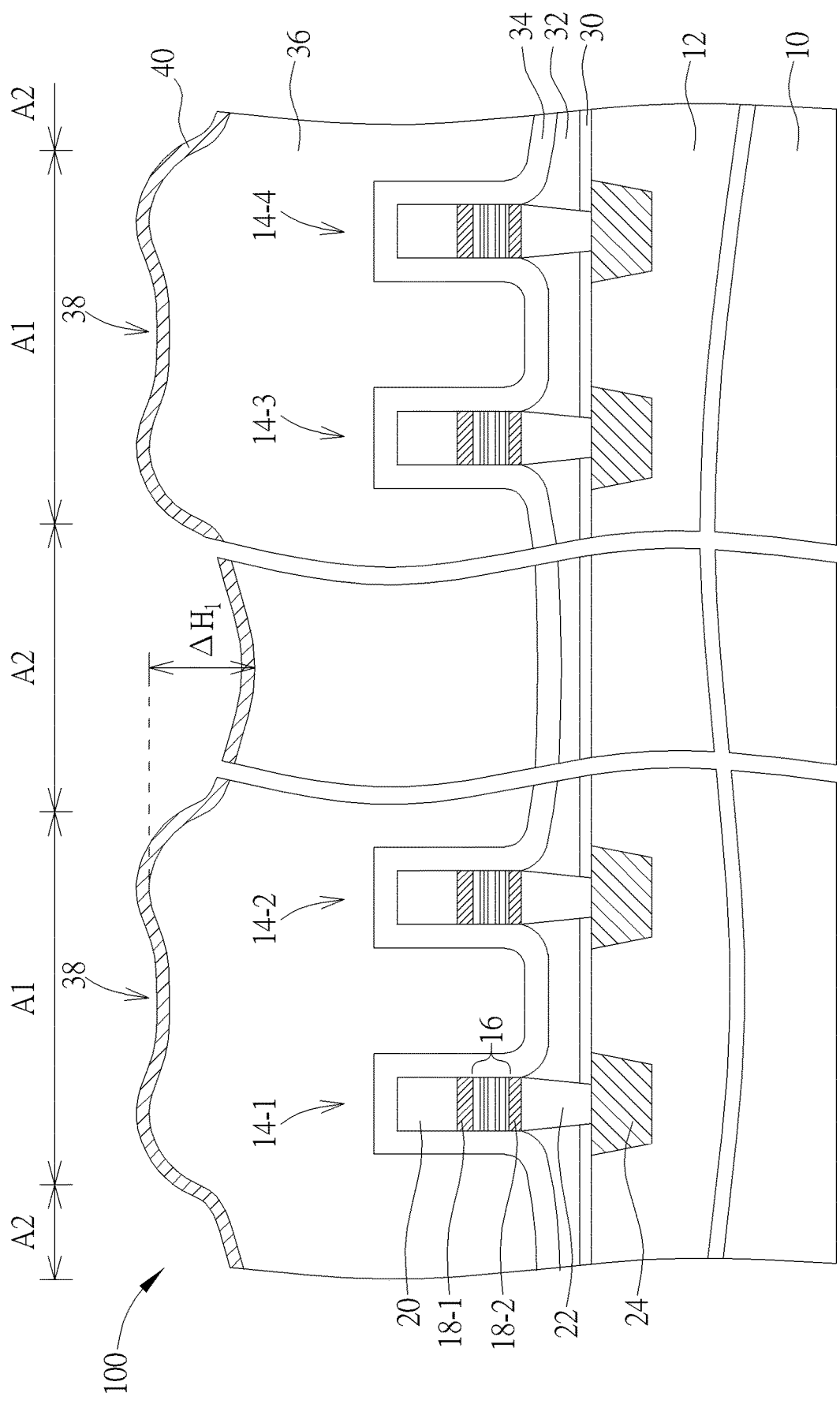
FIG. 2 is a schematic cross-sectional view of a semiconductor device after depositing a mask layer in accordance with an embodiment of the present disclosure.

FIG. 2 is a cross-sectional view of a semiconductor device after depositing a mask layer in accordance with one embodiment of the present disclosure. Referring to FIG. 2, a mask layer 40 may be deposited on the top surface of the second interlayer dielectric 36 such that the mask layer 40 may conformally cover the entire top surface of the second interlayer dielectric 36. According to an embodiment of the present disclosure, the composition of the mask layer 40 may be different from the composition of the second interlayer dielectric 36, so that the mask layer 40 is removed at a lower rate than the rate at which the second interlayer dielectric 36 is removed in the subsequent planarization process. For example, the mask layer 40 may be a single layer or a composite layer including TiN or SiN, and the thickness may be 1% to 10% of the thickness of the second interlayer dielectric 36. In a subsequent planarization process, the etch rate ratio (or etch selectivity ratio) between the mask layer 40 and the second interlayer dielectric 36 may be between 1:5 and 1:1000.

In addition, according to other embodiments of the present disclosure, in order to enable the subsequent planarization process to more effectively reduce the height difference of the second interlayer dielectric 36 in different regions, particularly the first height difference ΔH1, an optional single-layered or multi-layered dielectric layer, such as an ultra-low dielectric constant dielectric layer, TEOS, or PEOS, may be deposited over the mask layer 40, but not limited thereto.

Figure 3:
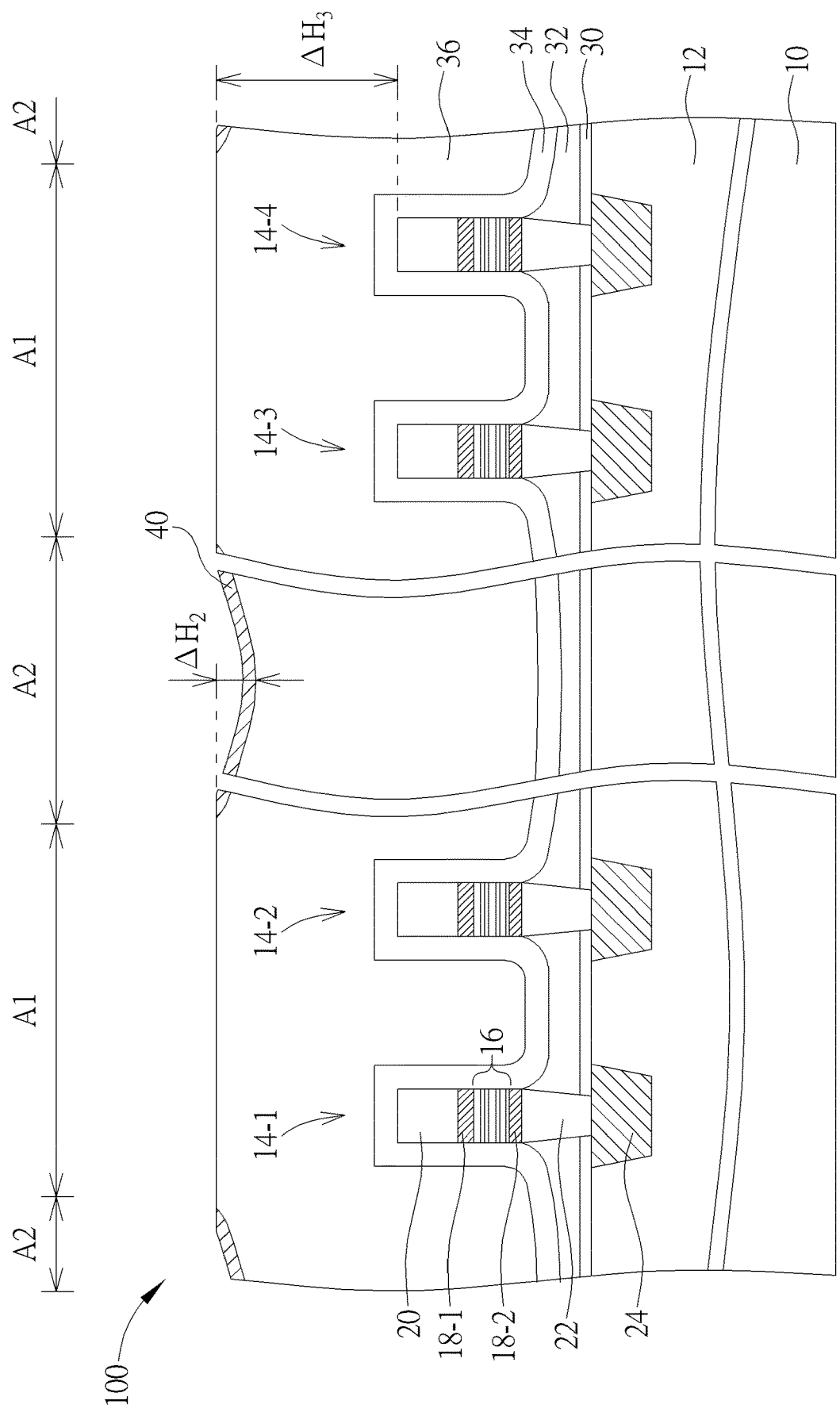
FIG. 3 is a schematic cross-sectional view showing a semiconductor device in which a planarization process is performed on a second interlayer dielectric and a mask layer according to an embodiment of the present disclosure.

FIG. 3 is a cross-sectional view showing a semiconductor device in which a planarization process is performed on a second interlayer dielectric and a mask layer according to one embodiment of the present disclosure. Next, a planarization process may be performed on the semiconductor device 100 of FIG. 2 such that the second interlayer dielectric 36 is lowered from the original first height difference ΔH1 to the second height difference ΔH2 to thereby form a structure as shown in FIG. 3. Referring to FIG. 3, after performing the planarization process, there may be a height difference, i.e. a third height difference ΔH3, between the top surface of the second interlayer dielectric 36 in the memory region A1 and the top surface of the mask layer 20 in the embedded MRAM cells 14-1 to 14-4. In addition, the mask layer 40 initially disposed in the memory region A1 is also completely removed, so that the mask layer 40 remains only in the logic region A2. Therefore, when the planarization process is completed, the entire top surface of the second interlayer dielectric 36 in the memory region A1 is exposed to the mask layer 40, and the top surface of the second interlayer dielectric 36 in the logic region A2 may be partially exposed from the mask layer 40.

Since the area of the logic region A2 is much larger than the area of the memory region A1, the mask layer 40 may cover most of the logic region A2. By setting the etch selectivity ratio between the mask layer 40 and the second interlayer dielectric 36 between 1:5 and 1:1000, when an etching rate is found to be greatly reduced or a signal being detected indicates that a large amount of the mask layer 40 is being polished during the planarization process, it means that the planarization process has reached the end point, which makes the end point of the planarization process easier to be determined.

Figure 4:
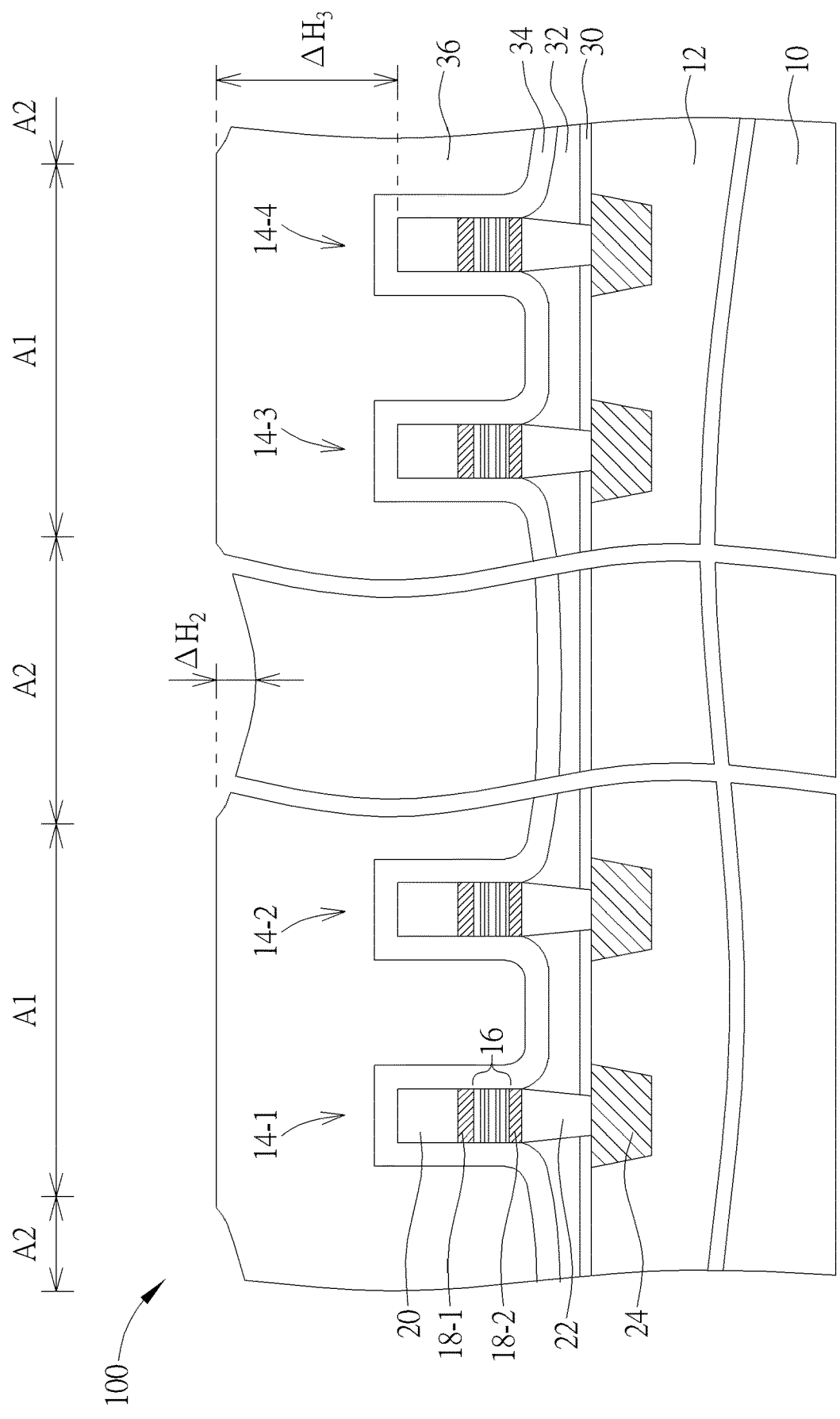
FIG. 4 is a schematic cross-sectional view of a semiconductor device with a mask layer removed in accordance with an embodiment of the present disclosure.

FIG. 4 is a cross-sectional view of a semiconductor device with a mask layer removed in accordance with one embodiment of the present disclosure. Next, an etch process, such as a dry etch process or a wet etch process, may be performed on the semiconductor device 100 of FIG. 3 to completely remove the mask layer 40 over the second interlayer dielectric 36. In this etching process, the etching rate of the etchant to the mask layer 40 is much higher than the etching rate of the etchant to the second interlayer dielectric 36, and the etching rate between the two may be between 5:1 and 1000:1. Therefore, when the etching process is finished, the height difference between the top surfaces of the second interlayer dielectric 36 in different regions may still be equal to or slightly smaller than the aforementioned second height difference ΔH2.

Figure 5:
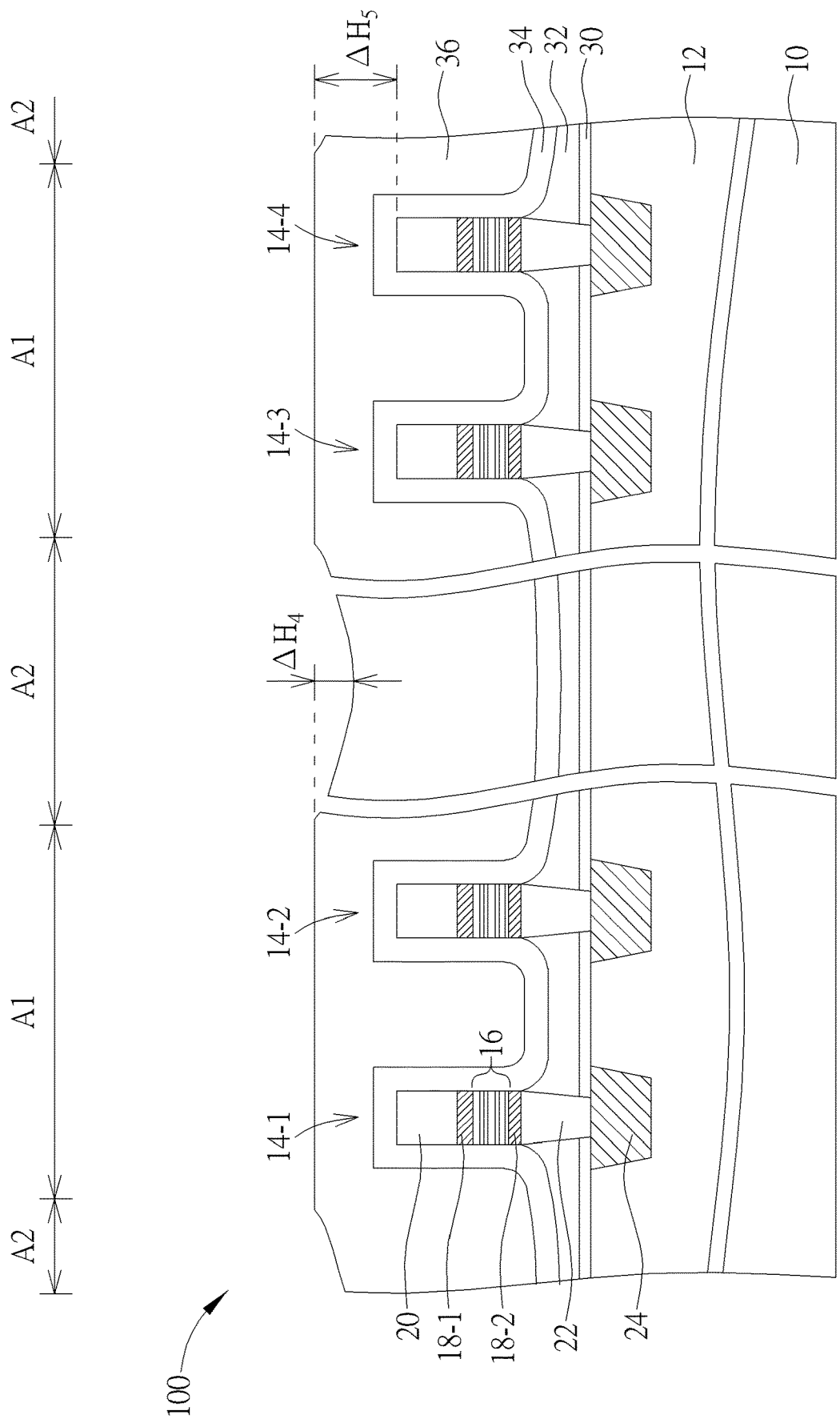
FIG. 5 is a cross-sectional view of a semiconductor device after planarizing a second interlayer dielectric in accordance with an embodiment of the present disclosure.

FIG. 5 is a cross-sectional view of a semiconductor device after planarizing a second interlayer dielectric in accordance with one embodiment of the present disclosure. Next, another planarization process may be performed on the semiconductor device 100 of FIG. 4 to further reduce the height (or thickness) of the second interlayer dielectric 36 to obtain a structure as shown in FIG. 5. Referring to FIG. 5, after the planarization process is performed, the height difference of the second interlayer dielectric 36 between regions A1 and A2 is reduced from the original second height difference ΔH2 to a fourth height difference ΔH4. For the memory region A1, the height difference between the top surface of the second interlayer dielectric 36 and the top surface of the mask layer 20 of the embedded MRAM cells 14-1 to 14-4 is reduced from the original third height difference ΔH3 to a fifth height difference ΔH5.

Figure 6:
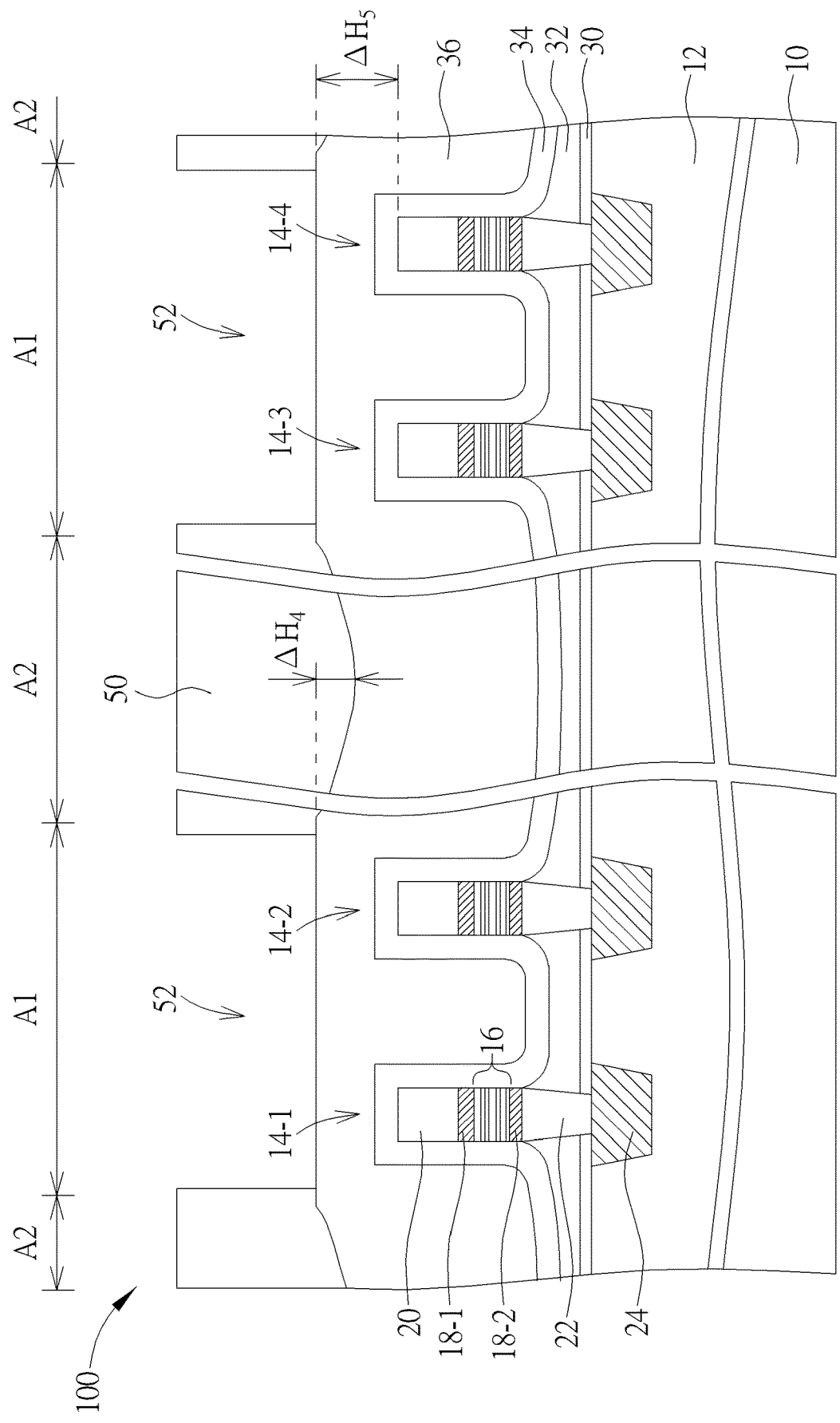
FIG. 6 is a schematic cross-sectional view of a semiconductor device after a patterned mask layer is formed on a second interlayer dielectric in accordance with an embodiment of the present disclosure.

FIG. 6 is a cross-sectional view of a semiconductor device after a patterned mask layer is formed on a second interlayer dielectric in accordance with an embodiment of the present disclosure. Next, a patterned mask layer 50 may be formed on the second interlayer dielectric 36. According to an embodiment of the present disclosure, the patterned mask layer 50 may be a patterned photoresist layer that may be formed by a suitable photolithography process. In addition, according to another embodiment of the present disclosure, the patterned mask layer 50 may also be a patterned dielectric layer, which may be formed by a suitable deposition, photolithography, or etching process. The patterned mask layer 50 may have at least one opening 52 disposed in the memory region A1 and preferably not disposed in the logic region A2. In other words, only the second interlayer dielectric 36 located within the memory region A1 may be exposed from the opening 52.

Figure 7:
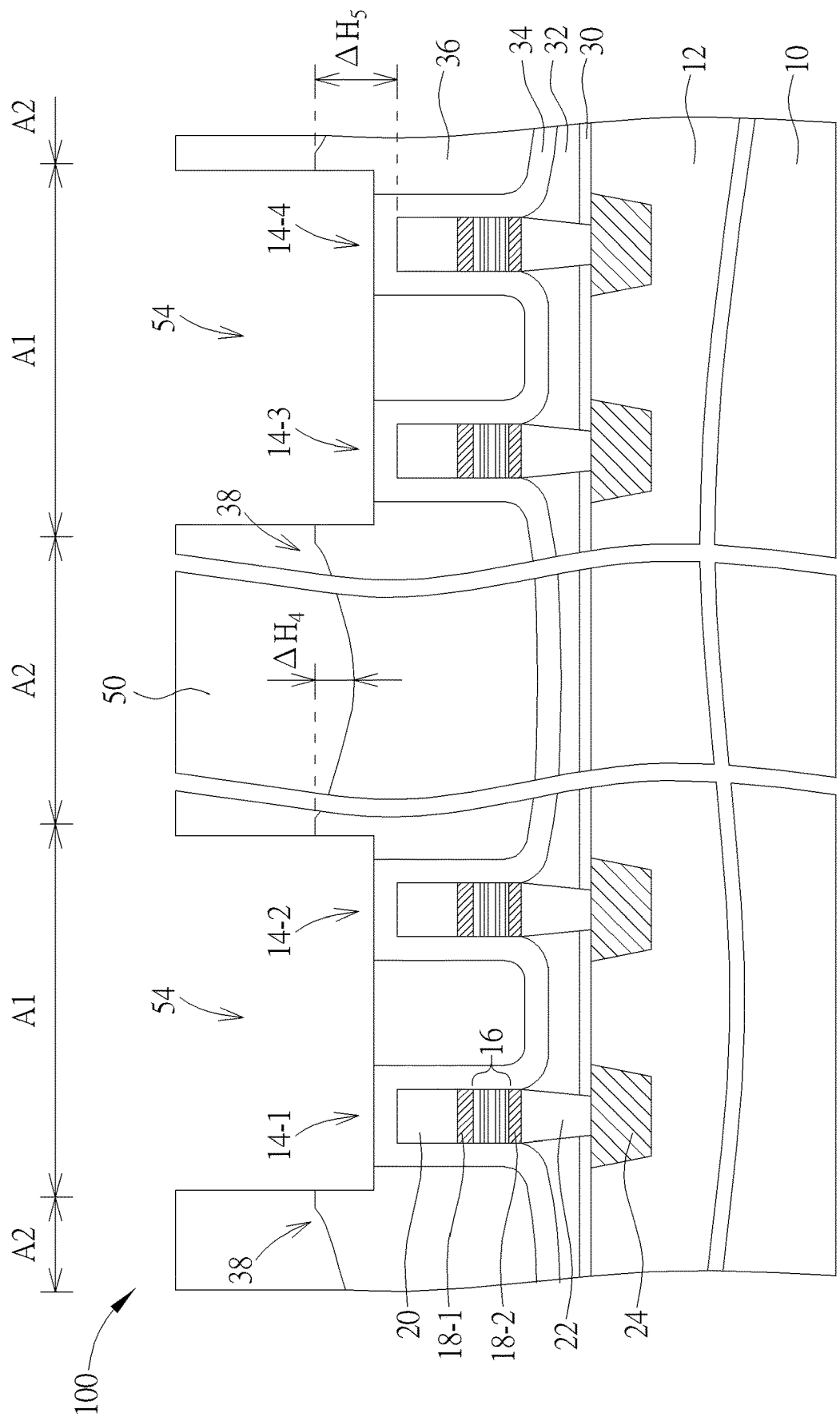
FIG. 7 is a schematic cross-sectional view of a semiconductor device that etches a second interlayer dielectric exposed to an opening in accordance with an embodiment of the present disclosure.

FIG. 7 is a cross-sectional view of a semiconductor device after etching a second interlayer dielectric exposed from an opening in accordance with one embodiment of the present disclosure. Referring to FIG. 7, an etching process may be performed to etch the second interlayer dielectric 36 exposed from the opening 52 until the protection layers 34 of the embedded MRAM cells 14-1 to 14-4 are exposed. During the etching process, when the protection layer 34 is etched, since the composition of the protection layer 34 is different from the composition of the second interlayer dielectric 36, the concentration of the etching products may be detected by the detector and used as an indicator to determine whether the end point of the etching process is reached. When the etching process is finished, a trench 54 may be formed in the second interlayer dielectric 36, such that the side of the trench 54 is surrounded by the second interlayer dielectric 36, or is regarded as being surrounded by the remaining protrusion portion 38, and the bottom surface of the trench 54 may be substantially aligned with the top surface of protection layer 34.

Then, the patterned mask layer 50 may be further removed, and another etching process or a planarization process may be performed to obtain a flat second interlayer dielectric 36.

Figure 8:
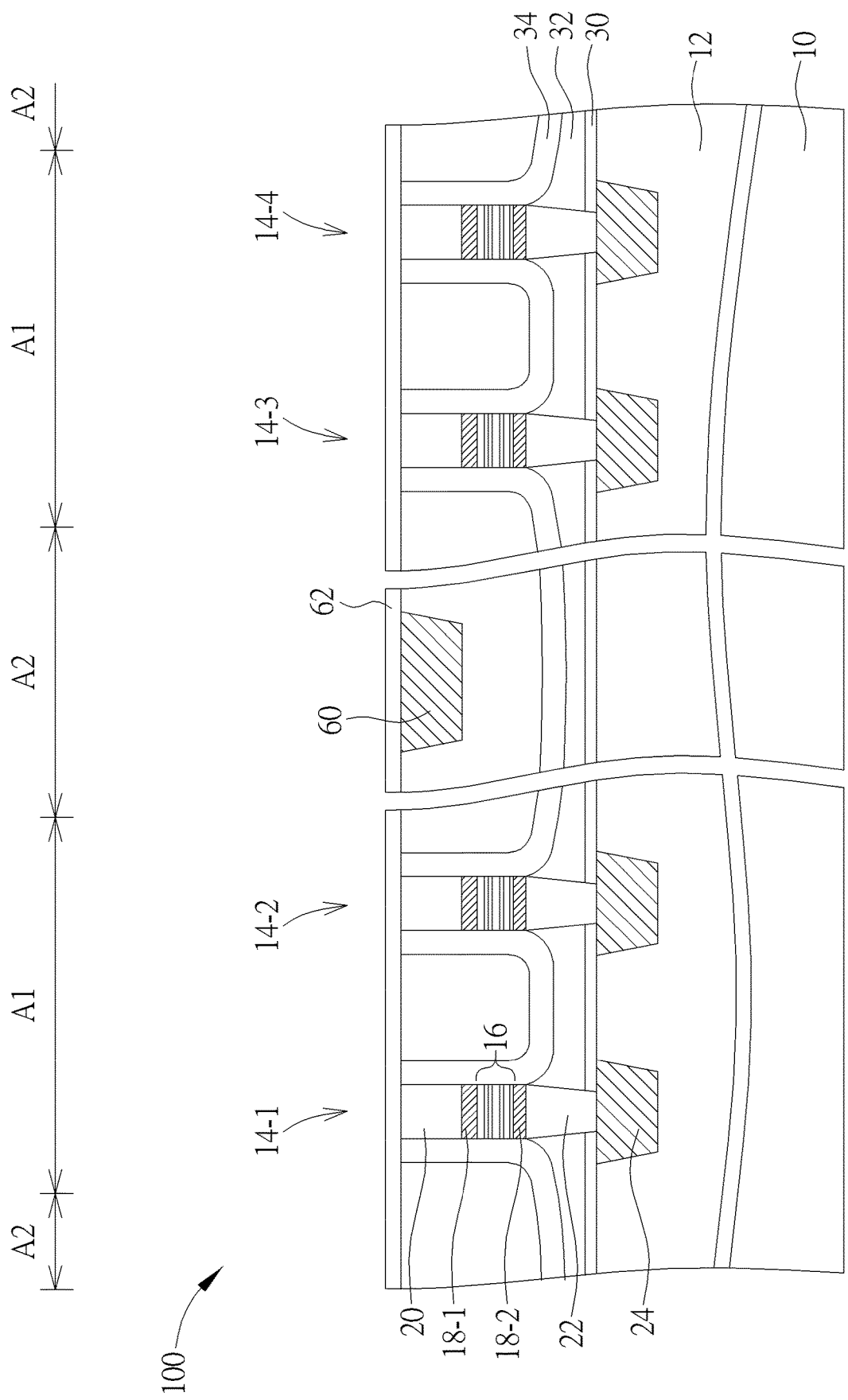
FIG. 8 is a schematic cross-sectional view of a semiconductor device in which a conductive interconnection is formed in a second interlayer dielectric in accordance with an embodiment of the present disclosure.

FIG. 8 is a cross-sectional view of a semiconductor device in which a conductive interconnection is formed in a second interlayer dielectric in accordance with one embodiment of the present disclosure. Next, referring to FIG. 8, a metal interconnection 60 may be formed in the second interlayer dielectric 36 (or formed at the top surface of the second interlayer dielectric 36). Next, an etch stop layer 62 is deposited on the top surface of the second interlayer dielectric 36 and the metal interconnection 60. In the subsequent process, an interlayer dielectric, a conductive interconnection or a conductive plug may be further formed on the etch stop layer 62 according to different requirements so that the top electrode 18-1 of each of the embedded MRAM cells 14-1 to 14-4 may be electrically coupled to other semiconductor components or elements.

Figure 9:
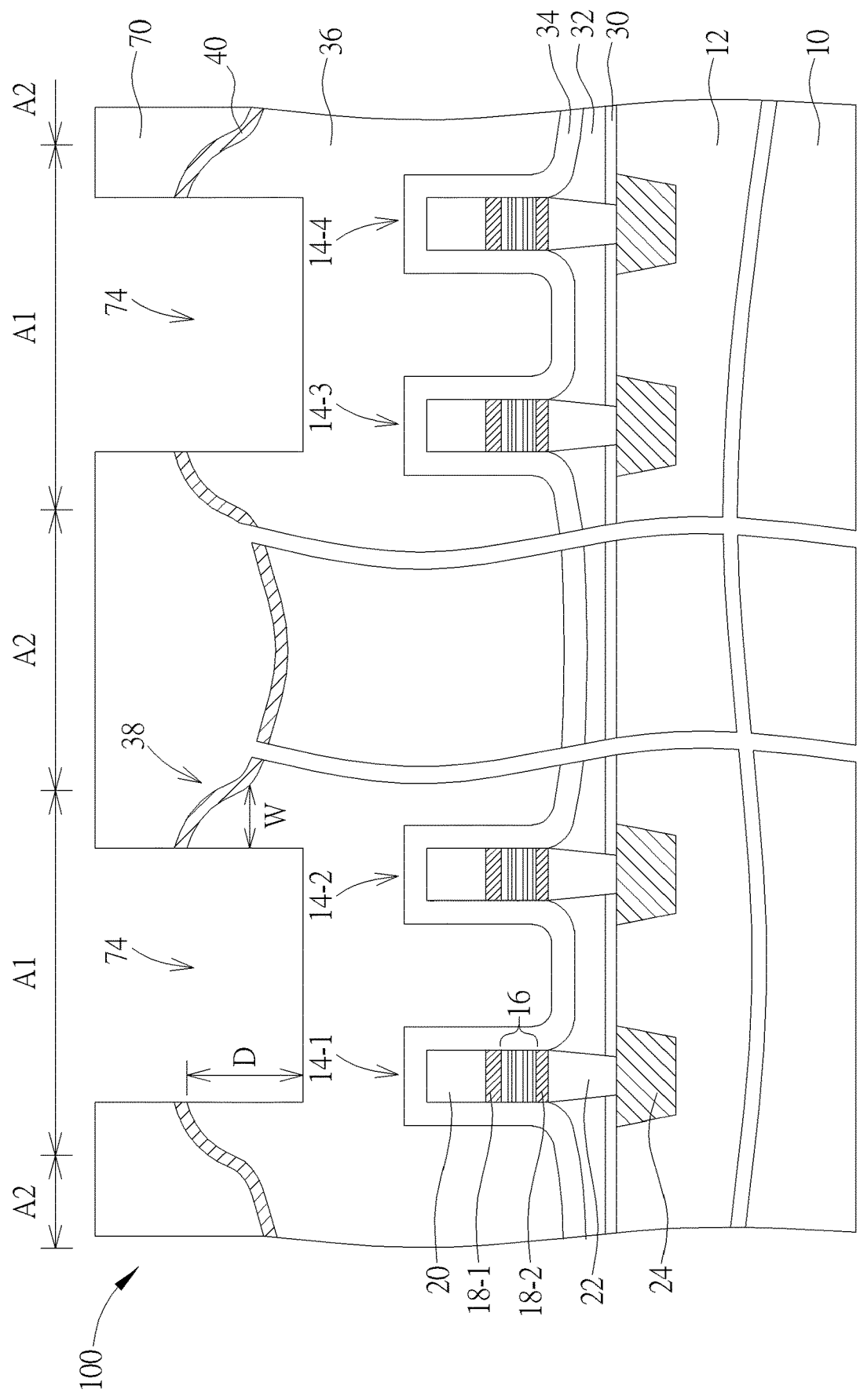
FIG. 9 is a schematic cross-sectional view of a semiconductor device in which a trench is formed in a second interlayer dielectric according to another embodiment of the present disclosure.

FIG. 9 is a cross-sectional view of a semiconductor device in which a trench is formed in a second interlayer dielectric according to another embodiment of the present disclosure. According to another embodiment of the present disclosure, a trench may be formed in the protrusion 38 of the second interlayer dielectric 36 during the processing stages of FIGS. 2 and 3 so as to facilitate the subsequent process of planarizing the second interlayer dielectric 36. Referring to FIG. 9, after completing the processing stage of FIG. 2, a patterned mask layer 70 may be formed on the second interlayer dielectric 36 and the mask layer 40. According to an embodiment of the present disclosure, the patterned mask layer 70 may be a patterned photoresist layer that may be formed by a suitable photolithography process. In addition, according to another embodiment of the present disclosure, the patterned mask layer 70 may also be a patterned dielectric layer, which may be formed by a suitable deposition, photolithography, or etching process. The patterned mask layer 70 may have at least one opening disposed in the memory region A1 and preferably not disposed in the logic region A2. In other words, only the mask layer 40 located in the memory region A1 may be exposed from the opening.

Next, as shown in FIG. 9, an etching process may be performed to etch the mask layer 40 and the second interlayer dielectric 36 exposed from the openings to form the trench 74 in the second interlayer dielectric 36. The trench 74 may be considered to be disposed in the protrusion portion 38 of the second interlayer dielectric 36 such that the trench 74 may be surrounded by the remaining protrusion portion 38. The depth D of the trench 74 may be between 500 angstroms and 2000 angstroms, and the width W of the bottom surface of the remaining protrusion portion may be between 0.25 micrometers (μm) and 0.35 micrometers.

After the trench 74 is completed, a process similar to that shown in FIG. 3 may then be performed to remove the patterned mask layer 70 and most of the protrusion portion 38. Since the area of the logic region A2 is much larger than the area of the memory region A1, the mask layer 40 may cover most of the logic region A2. By setting the etching selectivity ratio between the mask layer 40 and the second interlayer dielectric 36 between 1:5 and 1:1000, when an etching rate is found to be greatly reduced or a signal being detected indicates that a large amount of the mask layer 40 is being polished during the planarization process, it means that the planarization process has reached the end point, which makes the end point of the planarization process easier to be determined.

Figure 10:
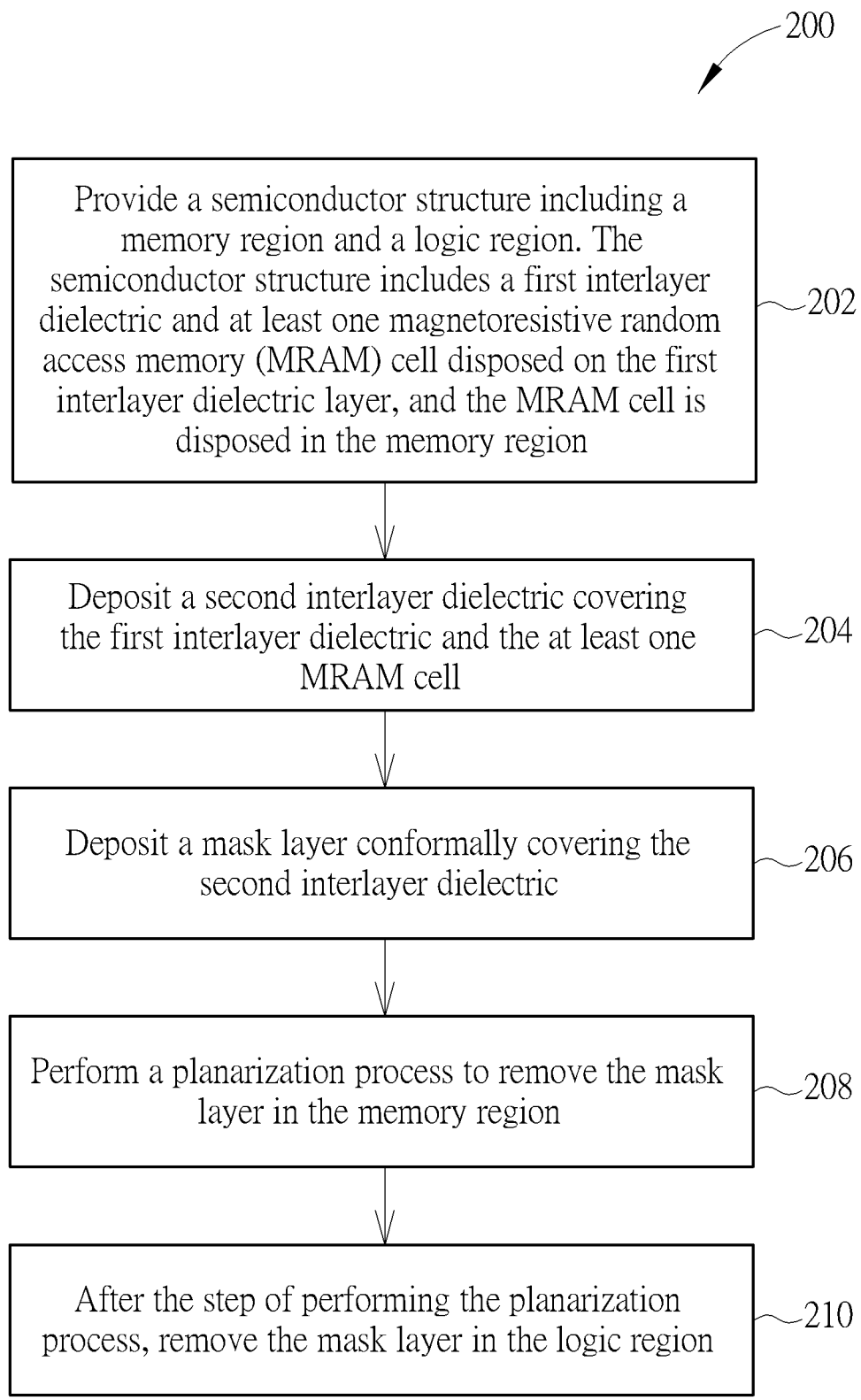
FIG. 10 is a flow chart of a method of fabricating a semiconductor device according to an embodiment of the present disclosure.

FIG. 10 is a flow chart of a method of fabricating a semiconductor device according to an embodiment of the present disclosure. The method includes the following steps. Step 202: provide a semiconductor structure including a memory region and a logic region. The semiconductor structure includes a first interlayer dielectric and at least one magnetoresistive random access memory (MRAM) cell disposed on the first interlayer dielectric, and the MRAM cell is disposed in the memory region. Step 204: deposit a second interlayer dielectric covering the first interlayer dielectric and the at least one MRAM cell. Step 206: deposit a mask layer conformally covering the second interlayer dielectric. Step 208: perform a planarization process to remove the mask layer in the memory region. Step 210: after the step of performing the planarization process, remove the mask layer in the logic region.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The Summary and Abstract sections may set forth one or more but not all exemplary embodiments of the present disclosure as contemplated by the inventor(s), and thus, are not intended to limit the present disclosure and the appended claims in any way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device comprising an embedded magnetoresistive random access memory (embedded MRAM), comprising:
   providing a semiconductor structure comprising a memory region and a logic region, wherein the semiconductor structure comprises a first interlayer dielectric and at least one magnetoresistive random access memory (MRAM) cell disposed on the first interlayer dielectric, and the at least one MRAM cell is disposed in the memory region;
   depositing a second interlayer dielectric covering the first interlayer dielectric and the at least one MRAM cell;

depositing a mask layer conformally covering the second interlayer dielectric;

forming a patterned mask layer on the mask layer, wherein the patterned mask layer comprises an opening in the memory region;

etching the mask layer and the second interlayer dielectric exposed from the opening of the patterned mask layer, wherein a top surface of the at least one MRAM cell is covered by the second interlayer dielectric after etching the second interlayer dielectric exposed from the opening of the patterned mask layer;

performing a planarization process to remove the mask layer in the memory region after the step of etching the mask layer and the second interlayer dielectric exposed from the opening of the patterned mask layer; and removing the mask layer in the logic region after the step of performing the planarization process.

2. The method of fabricating a semiconductor device comprising an embedded MRAM of claim 1, further comprising concurrently forming a trench in the second interlayer dielectric during the step of etching the mask layer and the second interlayer dielectric exposed from the opening of the patterned mask layer.

3. The method of fabricating a semiconductor device comprising an embedded MRAM of claim 1, wherein the patterned mask layer is a patterned photoresist.

4. A method of fabricating an embedded MRAM, comprising:

providing a semiconductor structure comprising a first interlayer dielectric and at least one MRAM cell disposed on the first interlayer dielectric;

depositing a second interlayer dielectric covering the first interlayer dielectric and the at least one magnetoresistive random access memory cell, wherein the second interlayer dielectric comprises a protrusion portion disposed on the MRAM cell;

depositing a mask layer conformally covering the second interlayer dielectric;

forming a patterned mask layer on the mask layer, wherein the patterned mask layer comprises an opening exposing the protrusion portion;

etching the protrusion portion of the second interlayer dielectric exposed from the opening to form a trench in the protrusion portion, wherein a bottom surface of the trench is located in the second interlayer dielectric, and the trench is located directly above the MRAM cell, and the second interlayer dielectric covers a top surface of the at least one MRAM cell; and performing a planarization process to remove the protrusion portion and the patterned mask layer.

5. The method of fabricating a semiconductor device comprising an embedded MRAM of claim 4, further comprising concurrently forming the trench and a residual protrusion portion at a side of the trench during the step of etching the protrusion portion exposed from the opening.

6. The method of fabricating a semiconductor device comprising an embedded MRAM of claim 5, wherein a depth of the trench is between 500 angstroms and 2000 angstroms.

7. The method of fabricating a semiconductor device comprising an embedded MRAM of claim 5, wherein a width of a bottom of the residual protrusion portion is between 0.25 μm and 0.35 μm.

8. The method of fabricating a semiconductor device comprising an embedded MRAM of claim 4, wherein an etching selectivity between the mask layer and the second interlayer dielectric is between 1:5 and 1:1000 during the step of performing the planarization process to remove the protrusion portion.

9. The method of fabricating a semiconductor device comprising an embedded MRAM of claim 4, wherein the method further comprises removing all of the mask layer after the step of performing the planarization process to remove the protrusion portion and the patterned mask layer.

* * * * *